United States Patent
Naka et al.

(10) Patent No.: US 6,800,945 B2
(45) Date of Patent: Oct. 5, 2004

(54) MULTI-CHIP SEMICONDUCTOR DEVICE WITH SPECIFIC CHIP ARRANGEMENT

(75) Inventors: Yasuhiro Naka, Chiyoda-machi (JP);
Naotaka Tanaka, Chiyoda-machi (JP);
Ikuo Yoshida, Musashimurayama (JP);
Satoshi Imasu, Hitachinaka (JP);
Takahiro Naito, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 59 days.

(21) Appl. No.: 10/117,845

(22) Filed: Apr. 5, 2002

(65) Prior Publication Data

US 2002/0145204 A1 Oct. 10, 2002

(30) Foreign Application Priority Data

Apr. 6, 2001 (JP) ........................................ 2001-107915

(51) Int. Cl.[7] .................... H01L 23/0602; H01L 23/48; H01L 23/52; H01L 29/40
(52) U.S. Cl. ...................... 257/778; 257/780; 257/684; 257/686
(58) Field of Search ................................ 257/684, 688, 257/777–795

(56) References Cited

U.S. PATENT DOCUMENTS 6,356,453 B1 * 3/2002 Juskey et al. ............... 257/778

FOREIGN PATENT DOCUMENTS

| JP | 06-244238 | 9/1994 |
|---|---|---|
| JP | 11-220077 | 8/1999 |
| JP | 2000-040775 | 2/2000 |

* cited by examiner

*Primary Examiner*—Cuong Nguyen
(74) *Attorney, Agent, or Firm*—Townsend and Townsend and Crew LLP

(57) ABSTRACT

In a multi-chip-module type semiconductor device, first and second semiconductor elements, a main component of each of the semiconductor elements being semiconductor material to form a semiconductor electric circuit in each of the semiconductor elements, are mounted on and electrically connected to a substrate adapted to be mounted onto a mother board and to be electrically connected to the mother board so that the each of the semiconductor elements is electrically connected to the mother board through the substrate.

18 Claims, 13 Drawing Sheets

FIG. 2

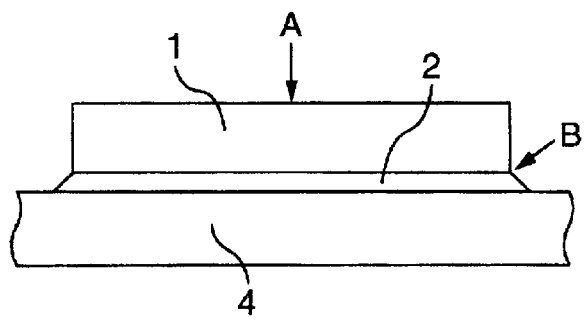

FIG. 3

| ANALYZED STRUCTURE | SEMICONDUCTOR ELEMENT CENTRAL PORTION MAXIMUM PRINCIPAL STRESS (MPa) | UNDERFILL OBLIQUE SURFACE END PORTION MAXIMUM PRINCIPAL STRESS (MPa) |
|---|---|---|
| SUBSTRATE (THICKNESS ABOUT 1mm), SEMICONDUCTOR ELEMENT (THICKNESS ABOUT 0.7mm), UNDERFILL (THICKNESS ABOUT 0.1mm), ABOUT 5mm <NUMBER OF ELEMENT 1> | 107 | 180 |
| 0.8mm <NUMBER OF ELEMENT 3, ELEMENT DISTANCE 0.8mm> | 109 | 183 |
| 2.0mm <NUMBER OF ELEMENT 3, ELEMENT DISTANCE 2.0mm> | 109 | 183 |

FIG. 6

| ℓ (mm) \ h (mm) | 0.07 | 0.4325 | 0.795 |
|---|---|---|---|
| 0.07 | | | |
| 0.4325 | 60/116 | | |
| 0.795 | 4/116 | 9/117 | |

$$\left(\frac{\text{PRINCIPAL STRESS AT UNDERFILL OBLIQUE SURFACE END PORTION (MPa)}}{\text{PRINCIPAL STRESS AT SEMICONDUCTOR ELEMENT CENTRAL PORTION (MPa)}}\right)$$

FIG. 7

| UNDERFILL OBLIQUE SURFACE SHAPE | SEMICONDUCTOR ELEMENT CENTRAL PORTION MAXIMUM PRINCIPAL STRESS (MPa) | UNDERFILL OBLIQUE SURFACE END PORTION MAXIMUM PRINCIPAL STRESS (MPa) |
|---|---|---|
| <UNIFORM SHAPE, OBLIQUE SURFACE END PORTION POSITION X> | 117 | X) 145 |
| <UNIFORM SHAPE, OBLIQUE SURFACE END PORTION POSITION Y> | 116 | Y) 165 |
| <NOT-UNIFORM SHAPE, BOTH OBLIQUE SURFACE END PORTION POSITION X AND Y> | 116 | X) 146 Y) 165 |

| UNDERFILL OBLIQUE SURFACE SHAPE | SEMICONDUCTOR ELEMENT CENTRAL PORTION MAXIMUM PRINCIPAL STRESS (MPa) | UNDERFILL OBLIQUE SURFACE END PORTION MAXIMUM PRINCIPAL STRESS (MPa) |
|---|---|---|
| 2.0mm <DISTANT> | 113 | 152 |
| 0.8mm <CONTINUOUS> | 113 | 152 |

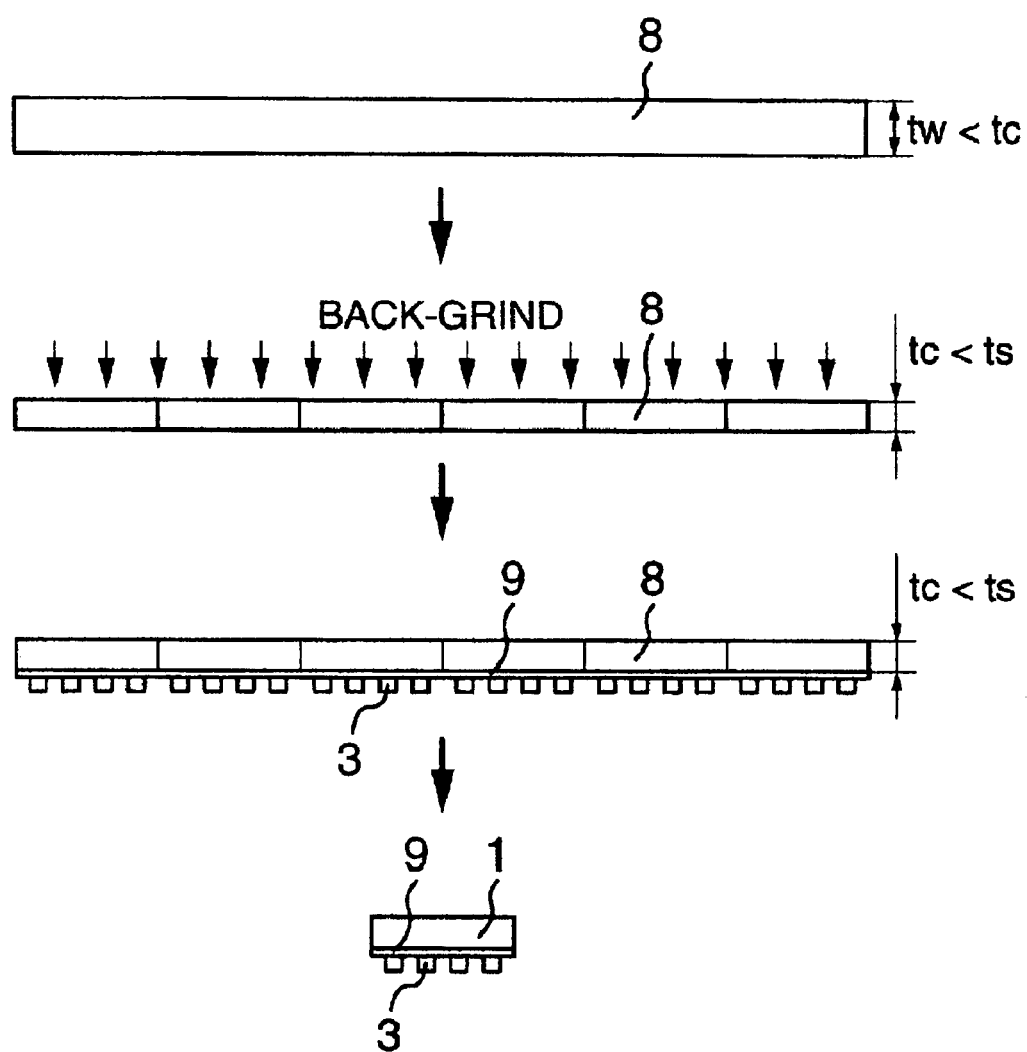

MULTI-CHIP SEMICONDUCTOR DEVICE WITH SPECIFIC CHIP ARRANGEMENT

This application is related to and claims priority from Japanese Application No. 2001-107915, filed Apr. 6, 2001.

BACKGROUND OF THE INVENTION AND RELATED ART STATEMENT

The present invention relates to a multi-chip-module (MCM) type semiconductor device.

JP-A-11-220077 discloses that a thermal expansion coefficient of a substrate is adjusted to restrain a crack of a semiconductor element or a under-fill layer. JP-A-2000-40775 discloses that a shape of an oblique surface of the under-fill layer is adjusted to restrain the crack of the semiconductor element. JP-A-6-244238 discloses that the semiconductor elements are mounted one by one onto a substrate sequentially in order of semiconductor element thickness from a minimum semiconductor element thickness.

OBJECT AND SUMMARY OF THE INVENTION

An object of the present invention is to provide a multi-chip-module (MCM) type semiconductor device of high-reliability against a bending deformation of the MCM type semiconductor device caused by an environment temperature variation during actual operation thereof, a mounting treatment of semiconductor element onto a substrate, a heat generation thereof during actual operation thereof or the like, with a difference in linear expansion coefficient between the semiconductor element and a substrate, a difference in temperature therebetween, an external force applied to the semiconductor device.

According to the invention, a multi-chip-module type semiconductor device comprises, first and second semiconductor elements, a main component of each of the semiconductor elements being semiconductor material to form a semiconductor electric circuit in each of the semiconductor elements, and a substrate adapted to be mounted onto a mother board and to be electrically connected to the mother board, on which substrate the first and second semiconductor elements are mounted to be electrically connected to the substrate, so that the first and second semiconductor elements are electrically connected to the mother board through the substrate.

If a thickness of the second semiconductor element is less than a thickness of the first semiconductor element when an area of the second semiconductor element is more than an area of the first semiconductor element as seen in a stacking direction in which each of the first and second semiconductor elements and the substrate are stacked and/or a length of a side of the second semiconductor element whose length is maximum in comparison with lengths of the other sides of the second semiconductor element as seen in the stacking direction is more than a length of a side of the first semiconductor element whose length is maximum in comparison with lengths of the other sides of the first semiconductor element as seen in the stacking direction, since a stress on a connecting member (for example, bumps) between the substrate and each of the semiconductor elements increases in accordance with an increase of the area and/or the length of the side whose length is maximum in comparison with lengths of the other sides while the stress on the connecting member (for example, bumps) between the substrate and each of the semiconductor elements decreases in accordance with a decrease of the thickness of each of the semiconductor elements, a crack on the connecting point or separation between the semiconductor element and the substrate at the connecting point is effectively prevented by decreasing the thickness of the second semiconductor element. It is preferable for the thickness of each of all semiconductor elements on the substrate to be not more than 0.4 mm.

The multi-chip-module type semiconductor device may further comprise a synthetic resin (corresponding to an under-fill) adhering to the substrate and each of the first and second semiconductor elements, and/or a wiring layer between the substrate and at least one of the first and second semiconductor elements, the wiring layer including a synthetic resin layer and an electrically conductive member (connecting electrically therethrough the substrate to the at least one of the first and second semiconductor elements) extending in a transverse direction transversing the stacking direction, in such a manner that an electrical connecting point between the semiconductor element and the electrically conductive member is distant away from an electrical connecting point between the electrically conductive member and the substrate in the transverse direction. When each of the first and second semiconductor elements includes a first surface facing to the substrate and a second surface as a reverse surface with respect to the first surface in a stacking direction in which each of the first and second semiconductor elements and the substrate are stacked, and the thickness of the second semiconductor element is smaller than the thickness of the first semiconductor element, it is preferable that the second surface of the first semiconductor element is prevented from being a grinder-finished surface while the second surface of the second semiconductor element is the grinder-finished surface.

If the thickness of the first semiconductor element is smaller than the thickness of the second semiconductor element when the multi-chip-module type semiconductor device further comprises a synthetic resin member (corresponding to the under-fill) adhering to the first semiconductor element and the substrate at the inside of the first semiconductor element as seen in the stacking direction, while a synthetic resin (for example, corresponding to the under-fill) whose Young's modulus is not less than Young's modulus of the synthetic resin member is prevented from adhering to the second semiconductor element and the substrate at the inside of the second semiconductor element as seen in the stacking direction, since a connecting rigidity between the first semiconductor element and the substrate connected to each other through bumps is made more than a connecting rigidity between the second semiconductor element and the substrate connected to each other through bumps, by reinforcing the connecting rigidity between the first semiconductor element and the substrate with the synthetic resin member, the stress on the semiconductor element increases in accordance with an increase of the connecting rigidity between the semiconductor element and the substrate, and the stress on the semiconductor element decreases in accordance with the decrease the thickness thereof on the substrate, the crack or excessive stress on the first semiconductor element whose connecting rigidity is reinforced by the synthetic resin member is effectively prevented.

If the thickness of the first semiconductor element is smaller than the thickness of the second semiconductor element when the multi-chip-module type semiconductor device further comprises a first synthetic resin through which the substrate and the first semiconductor element are connected to each other and a second synthetic resin through which the substrate and the second semiconductor element are connected to each other, and Young's modulus of the first synthetic resin (for example, corresponding to the under-fill) is larger than Young's modulus of the second synthetic resin (for example, corresponding to an elastomer stress or deformation absorbing layer 13), since the connecting rigidity between the first semiconductor element and the substrate connected to each other through bumps is made more than the connecting rigidity between the second semiconductor element and the substrate connected to each other through bumps, by relatively more effectively reinforcing the connecting rigidity between the first semiconductor element and the substrate with a difference in Young's modulus between the first synthetic resin and the second synthetic resin, the stress on the semiconductor element increases in accordance with the increase of the connecting rigidity between the semiconductor element and the substrate, and the stress on the semiconductor element decreases in accordance with the decrease of the thickness thereof on the substrate, the crack or excessive stress on the first semiconductor element whose connecting rigidity is reinforced relatively more effectively by the difference in Young's modulus between the first synthetic resin and the second synthetic resin is effectively prevented.

If the thickness of the first semiconductor element is smaller than the thickness of the second semiconductor element when the multi-chip-module type semiconductor device further comprises the first synthetic resin (for example, corresponding to the under-fill) adhering to the substrate and the first semiconductor element at the inside of the first semiconductor element as seen in the stacking direction, and a second synthetic resin (for example, corresponding to the sealing resin 10 and/or support plate 12) through which the second semiconductor element is connected to the substrate at the outside of the second semiconductor element as seen in the stacking direction while a synthetic resin (for example, corresponding to the under-fill) whose Young's modulus is not less than Young's modulus of the first synthetic resin is prevented from adhering to the second semiconductor element and the substrate at the inside of the second semiconductor element as seen in the stacking direction, since the connecting rigidity between the first semiconductor element and the substrate connected to each other through bumps with the first synthetic resin (for example, corresponding to the under-fill) adhering to the substrate and the first semiconductor element at the inside of the first semiconductor element as seen in the stacking direction is made more than the connecting rigidity between the second semiconductor element and the substrate through the second synthetic resin at the outside of the second semiconductor element as seen in the stacking direction without the synthetic resin whose Young's modulus is not less than Young's modulus of the first synthetic resin at the inside of the second semiconductor element as seen in the stacking direction so that the connecting rigidity between the second semiconductor element and the substrate is substantially formed by a bending low rigidity of the second synthetic resin, the stress on the semiconductor element increases in accordance with the increase of the connecting rigidity between the semiconductor element and the substrate, and the stress on the semiconductor element decreases in accordance with the decrease of the thickness thereof on the substrate, the crack or excessive stress on the first semiconductor element whose connecting rigidity is made more than the connecting rigidity between the second semiconductor element and the substrate is effectively prevented.

If the thickness of the second semiconductor element is smaller than the thickness of the first semiconductor element when a main component of the first semiconductor element is Si, a main component of the second semiconductor element is GaAs, since Young's modulus of GaAs is more than Young's modulus of Si, a rigidity against bending of the semiconductor element increases in accordance with an increase in Young's modulus of the semiconductor element, the stress on the semiconductor element increases in accordance with an increase of the rigidity against bending of the semiconductor element, and the stress on the semiconductor element decreases in accordance with the decrease in thickness thereof on the substrate, the crack or excessive stress on the second semiconductor element whose rigidity against bending is made more than the rigidity against bending of the first semiconductor element by a difference in Young's modulus between the first and second semiconductor elements is effectively prevented.

When each of the first and second semiconductor elements includes a first surface facing to the substrate and a second surface as a reverse surface with respect to the first surface in the stacking direction, and the second surface of the first semiconductor element is prevented from being a grinder-finished surface while the second surface of the second semiconductor element is the grinder-finished surface, an efficiency in heat discharge from each of the semiconductor elements can be adjusted desirably, because the efficiency in heat discharge from the semiconductor element changes in accordance with a thickness between the second surface and the electric circuit which is formed or treated from the first surface and the thickness between the second surface and the electric circuit can be adjusted by the grinder-finishing.

If a thickness of the second semiconductor element is less than a thickness of the first semiconductor element when an area of the second semiconductor element is less than an area of the first semiconductor element as seen in the stacking direction in which each of the first and second semiconductor elements and the substrate are stacked and/or a length of a side of the second semiconductor element whose length is minimum in comparison with lengths of the other sides of the second semiconductor element as seen in the stacking direction is less than a length of a side of the first semiconductor element whose length is minimum in comparison with lengths of the other sides of the first semiconductor element as seen in the stacking direction, since a stress on a side surface of each of the semiconductor elements (particularly, a connecting point between the side surface and a terminating end of an exposed surface of an under-fill adhering to the substrate and the semiconductor element) increases in accordance with a decrease of the area and/or the length of the side whose length is minimum in comparison with lengths of the other sides as shown in FIG. 9 (a possibility of crack occurrence on the second semiconductor element is more than that on the first semiconductor element when the thickness of the second semiconductor element is substantially equal to that of the first semiconductor element), it is difficult for the side surface to be correctly formed through dicing process for dividing a semiconductor wafer to the semiconductor elements sufficiently for securely preventing a stress concentration on the side surface, and the stress on the semiconductor element decreases in accordance with a decrease of the thickness thereof on the substrate, the crack on the side surface of the second semiconductor element is effectively prevented by decreasing the thickness of the second semiconductor element without excessive treatment of the side surface of the second semiconductor element.

Other objects, features and advantages of the invention will become apparent from the following description of the embodiments of the invention taken in conjunction with the accompanying drawings.

BRIEF DESCRIPTION OF THE DRAWINGS

FIG. 2 is a schematic side view of an imaginary multi-chip-module (MCM) type semiconductor device to be analyzed theoretically.

FIG. 3 is a table showing relationships among numbers of semiconductor elements, positional relationships between the semiconductor elements, stresses on the semiconductor elements and stresses on under-fills.

FIG. 6 is a table showing relationships among under-fill heights, under-fill widths, principal stresses at semiconductor element central portion, and principal stresses at under-fill oblique surface end portion.

FIG. 7 is a table showing relationships among under-fill oblique surface shapes, the principal stresses at semiconductor element central portion, and the principal stresses at under-fill oblique surface end portion.

FIG. 15 including schematic side views showing a semiconductor element producing process.

DETAILED DESCRIPTION OF PREFERRED EMBODIMENTS

In a multi-chip-module (MCM) type semiconductor device, semiconductor elements or chips are electrically connected to a substrate through solder or bumps of, for example, Au, and an under-fill of organic synthetic resin (for example, epoxy resin) of adhesive may be inserted between the semiconductor elements and the substrate to protect the solder or bumps. The substrate is made of a material having linear expansion coefficient of, for example, $10$–$20 \times 10^{-6}$ $K^{-1}$, so that a difference in linear expansion coefficient between the substrate and a mother board on which the substrate is mounted is decreased to maintain securely an electrical connection therebetween. On the other hand, in this case, a difference in linear expansion coefficient between the substrate and the semiconductor element including, for example, Si or another semiconductor material as a main component thereof is great.

It is difficult for the under-fill to have a correctly formed shape. Particularly, when a tape shaped synthetic resin (for example, anisotropic electrically conductive resin (ACF)) is heated and cooled under a compression between the substrate and the semiconductor element after being inserted therebetween to form the under-fill, it is extremely difficult for the under-fill to have the correctly formed shape.

Figure 4:
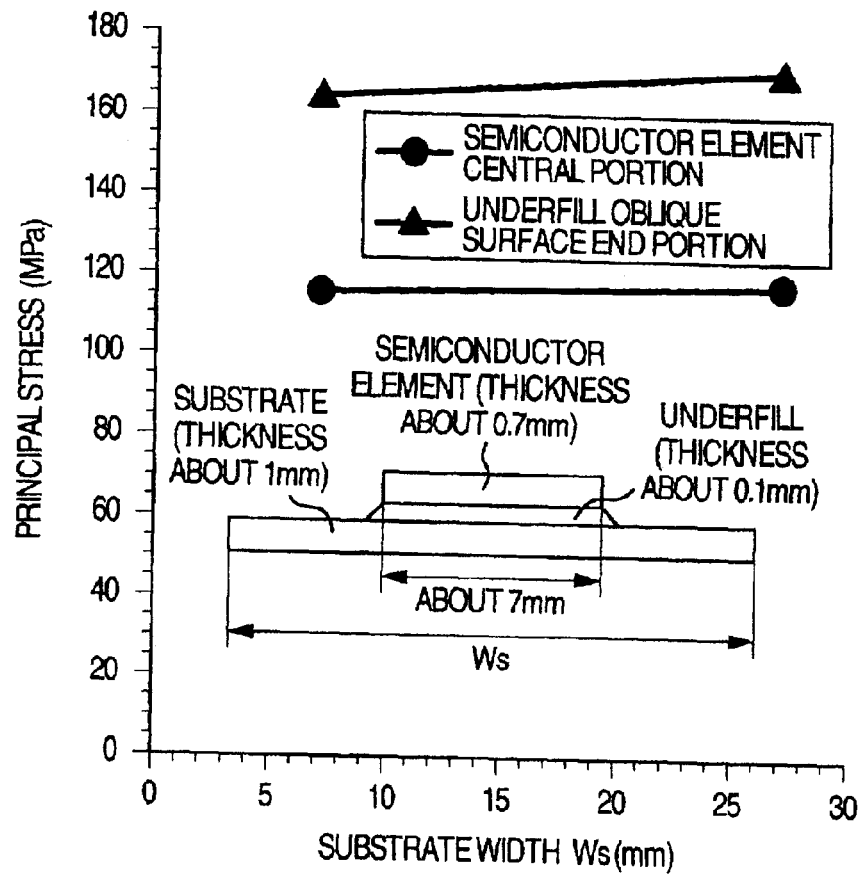
FIG. 4 is a diagram showing relationships between a substrate width and a principal stress.

A principal stress at a front surface central portion A of an imaginary semiconductor element (size: 0.1 mm×0.05 mm) and a principal stress at a cross point of stress concentration between the semiconductor element and an oblique surface of the under-fill (an under-fill oblique surface end portion B) finite element as shown in FIG. 2 within a temperature range between −55–125° C. was calculated through a twodimension elasticity finite-element analysis method. As shown in FIG. 3, a difference in number of semiconductor elements and a difference in distance between the semiconductor elements do not cause a significant change in principal stress at the semiconductor element central portion A and at the under-fill oblique surface end portion B. As shown in FIG. 4, a difference in size of the substrate does not cause the significant change in principal stress at the semiconductor element central portion A and at the under-fill oblique surface end portion B.

Figure 5:
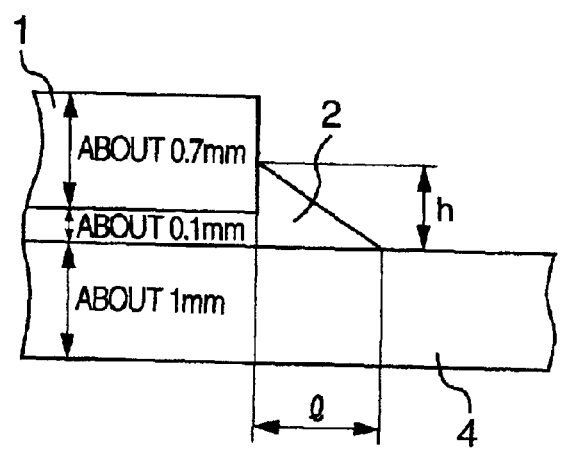
FIG. 5 is a schematic side view of a combination of an imaginary multi-chip-module (MCM) type semiconductor device and an imaginary under-fill to be analyzed theoretically.
Figures 8, 9:
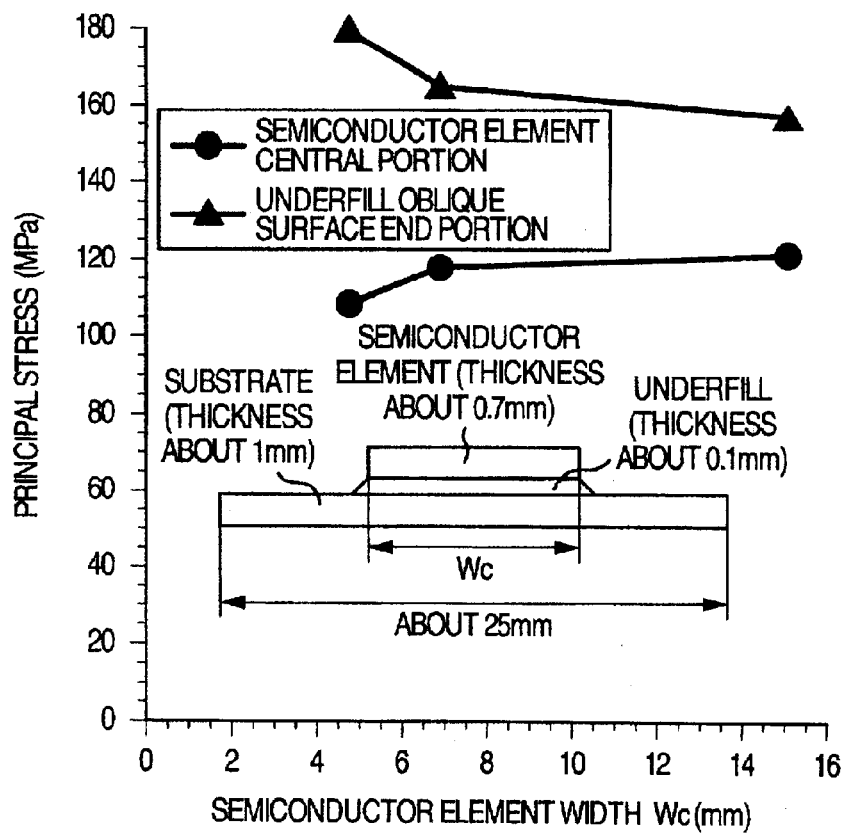
FIG. 8 is a table showing the other relationships among the under-fill oblique surface shapes, the principal stresses at semiconductor element central portion, and the principal stresses at under-fill oblique surface end portion.
FIG. 9 is a diagram showing relationships between a semiconductor element width and a principal stress.

When a height h and width l of the under-fill as shown in FIG. 5 vary, the principal stresses at the semiconductor element central portion A and at the under-fill oblique surface end portion B vary as follows. As shown in FIG. 6, the principal stress at the under-fill oblique surface end portion B becomes maximum, but the principal stress at the semiconductor element central portion A does not change significantly, when the under-fill oblique surface end portion B is on a lower surface of the semiconductor element and an angle between the under-fill oblique surface and the lower surface of the semiconductor element is 45 degrees (h=l). As shown in FIG. 7, a difference in shape between the under-fill oblique surfaces on one of the semiconductor elements does not cause a significant change of the principal stress at the semiconductor element central portion A and each of the under-fill oblique surface end portions B on the one of the semiconductor elements, while the principal stress at the under-fill oblique surface end portion B is determined or varies in accordance with a position of the under-fill oblique surface end portion B and the angle between the under-fill oblique surface and the lower surface of the semiconductor element. As shown in FIG. 8, the principal stresses at the semiconductor element central portion A and at the under-fill oblique surface end portion B do not change significantly in accordance with a distance between the semiconductor elements and a shape of the under-fill between the semiconductor elements. As shown in FIG. 9, the principal stresses do not vary significantly when the size of the semiconductor element is about 7–15 mm, but vary significantly when the size of the semiconductor element is less than 7 mm. In accordance with a decrease of the size of the semiconductor element, the principal stress at the semiconductor element central portion A decreases, and the principal stress at the under-fill oblique surface end portion B increases.

Therefore, the following analysis, it is imaginarily set that a width of the substrate is 25 mm, the under-fill oblique surface end portion B is on the lower surface of the semiconductor element while the angle between the under-fill oblique surface and the lower surface of the semiconductor element is 45 degrees (h=l), and a width of the semiconductor element is 7 mm. Further, it is imaginarily set that a main component of the semiconductor element is Si, Young's modulus of the semiconductor element is 190 GPa, a linear expansion coefficient of the semiconductor element is $3 \times 10^{-6} K^{-1}$, and Young's modulus of the substrate is 20 GPa.

Figure 10A:
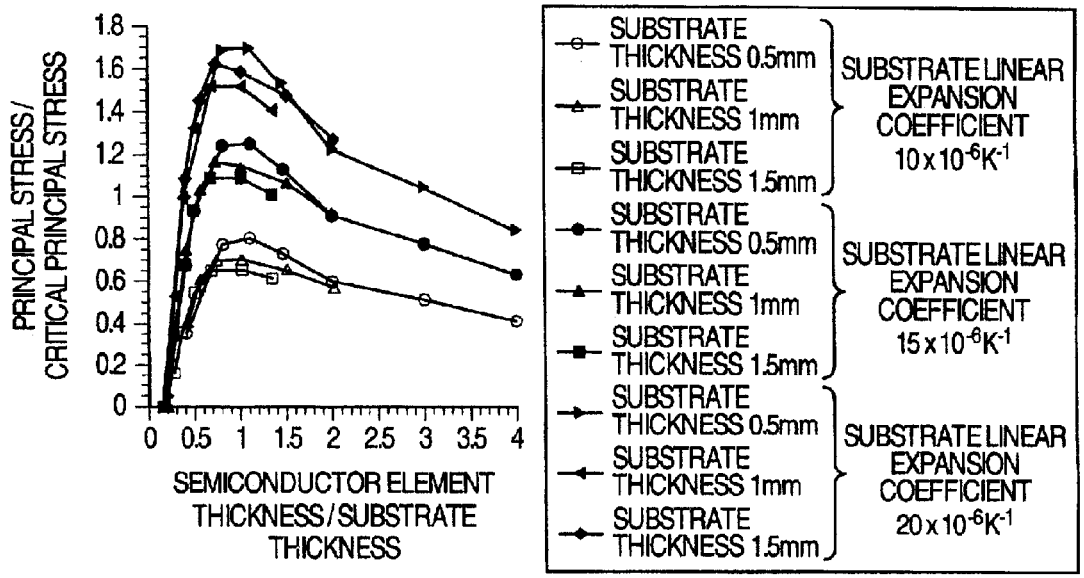
FIG. 10a is a diagram showing relationships among a rate of semiconductor element thickness to a substrate thickness, a rate of principal stress to critical principal stress, substrate thickness and substrate linear expansion coefficient, at the semiconductor element central portion.
Figure 10B:
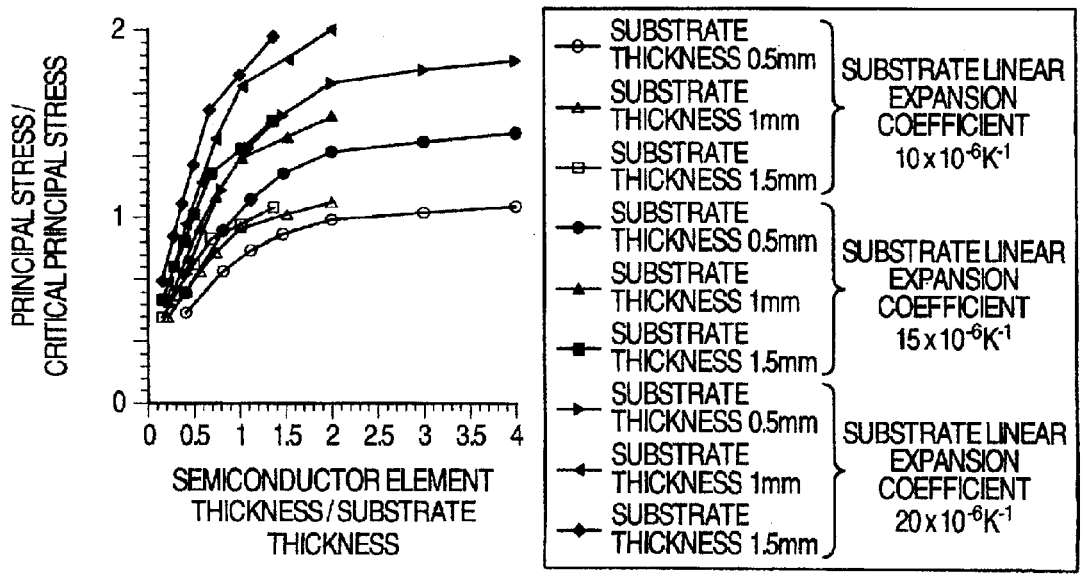
FIG. 10b is a diagram showing relationships among the rate of semiconductor element thickness to a substrate thickness, the rate of principal stress to critical principal stress, the substrate thickness and the substrate linear expansion coefficient, at the under-fill oblique surface end portion.

As shown in FIGS. 10a and 10b wherein a critical principal stress is a boundary stress value determining whether or not a crack occurs, Young's modulus of the under-fill is 10 GPa, a linear expansion coefficient of the under-fill is $35 \times 10^{-6} K^{-1}$, and a linear expansion coefficient of the substrate is changed within a range of $10-20 \times 10^{-6}$ $K^{-1}$ corresponding to the linear expansion coefficient of a synthetic resin substrate, the smaller a ratio of a semiconductor element thickness to a substrate thickness is, the smaller the principal stress at the semiconductor element central portion A is, while the smaller the ratio of the semiconductor element thickness to the substrate thickness is, the smaller the principal stress at the under-fill oblique surface end portion B is.

Figure 11A:
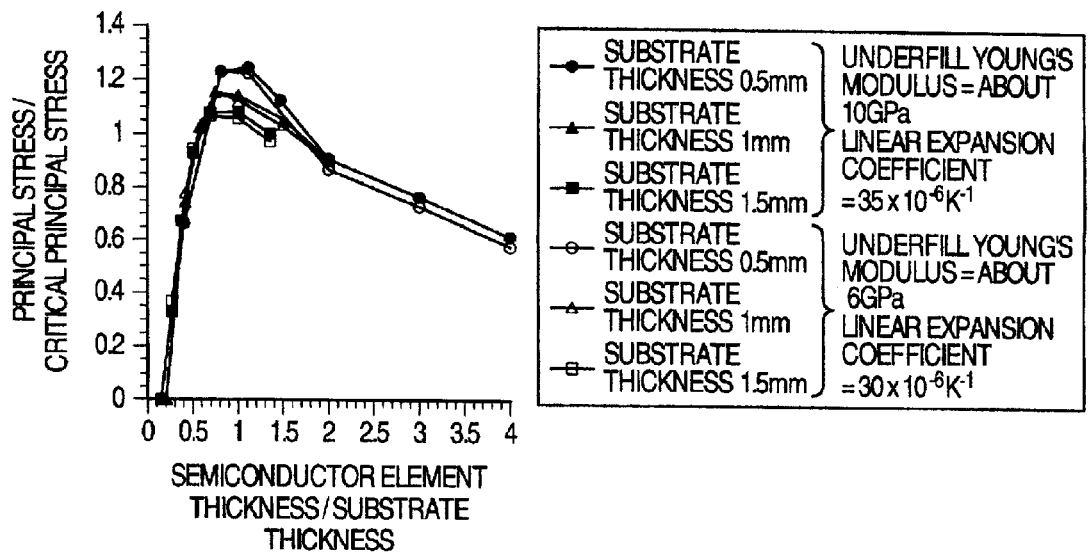
FIG. 11a is a diagram showing relationships among a rate of semiconductor element thickness to a substrate thickness, a rate of principal stress to critical principal stress, substrate thickness, an under-fill Young's modulus and an under-fill linear expansion coefficient, at the semiconductor element central portion.
Figure 11B:
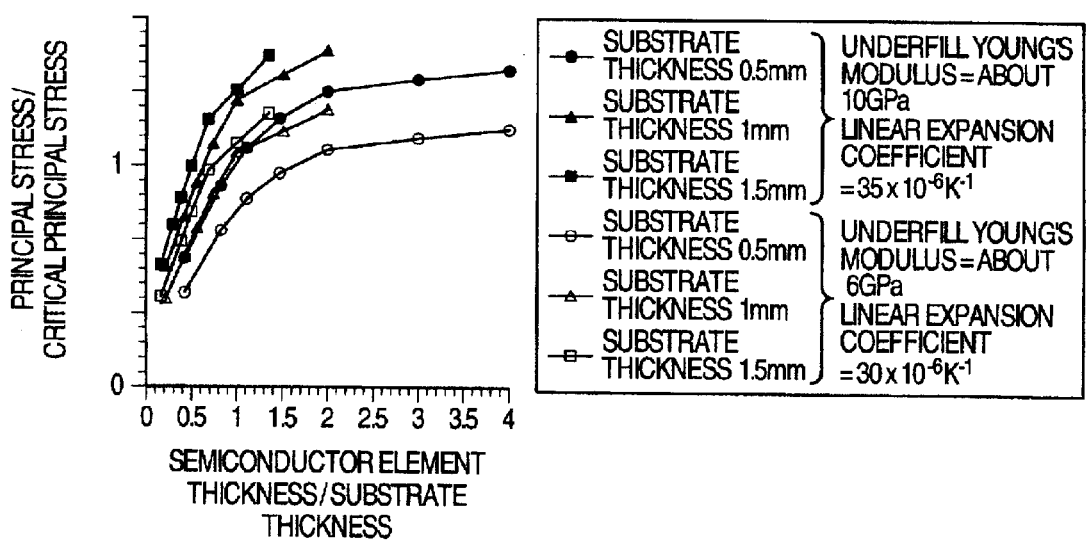
FIG. 11b is a diagram showing relationships among the rate of semiconductor element thickness to a substrate thickness, the rate of principal stress to critical principal stress, the substrate thickness, the under-fill Young's modulus and the under-fill linear expansion coefficient, at the under-fill oblique surface end portion.

As shown in FIGS. 11a and 11b wherein Young's modulus of the under-fill is 10 GPa and 6 GPa, the linear expansion coefficient of the under-fill is $35 \times 10^{-6} K^{-1}$ and $30 \times 10^{-6} K^{-1}$, and the linear expansion coefficient of the substrate is $15 \times 10^{-6} K^{-1}$, the principal stress at the semiconductor element central portion A is not changed in accordance with the linear expansion coefficient and Young's modulus of the under-fill, while the smaller the principal stress at the under-fill oblique surface end portion B is, the smaller the linear expansion coefficient and/or Young's modulus of the under-fill is.

As readable from FIGS. 10a, 10b, 11a and 11b, it is preferable for preventing the crack that the semiconductor element thickness is less than the substrate thickness and as small as possible, and the linear expansion coefficient of the substrate, the linear expansion coefficient of the under-fill and Young's modulus of the under-fill are as small as possible.

When the size of the semiconductor element is less than 7 mm, since in accordance with the decrease of the size of the semiconductor element, the principal stress at the semiconductor element central portion A decreases while the principal stress at the under-fill oblique surface end portion B increases, the crack is restrained from occurring, by making the thickness of a first semiconductor element smaller than the thickness of a second semiconductor element whose area is smaller than an area of the first semiconductor element as seen in the semiconductor and substrate stacking direction. Further, when a strength of an upper surface (a reverse surface with respect to the lower surface facing to the substrate) is smaller than the strength of the lower surface or significantly small, the crack is restrained from occurring, by making the thickness of the first semiconductor element smaller than the thickness of the second semiconductor element whose area is smaller than the area of the first semiconductor element as seen in the semiconductor and substrate stacking direction, because the larger the area of the semiconductor element is, the larger a possibility of occurrence of the crack is.

Figure 1A:
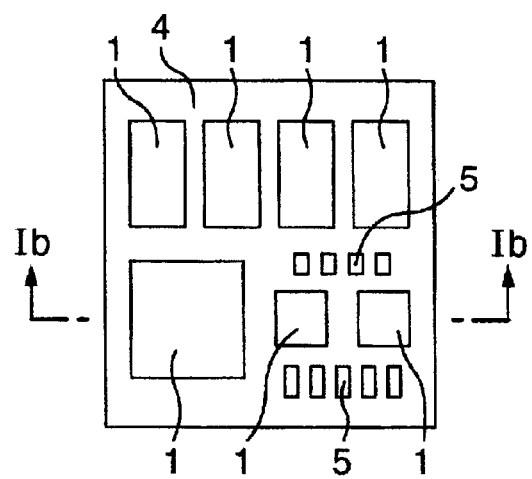
FIG. 1a is a schematic front view showing a multi-chip-module (MCM) type semiconductor device as a first embodiment of the invention.
Figure 1B:
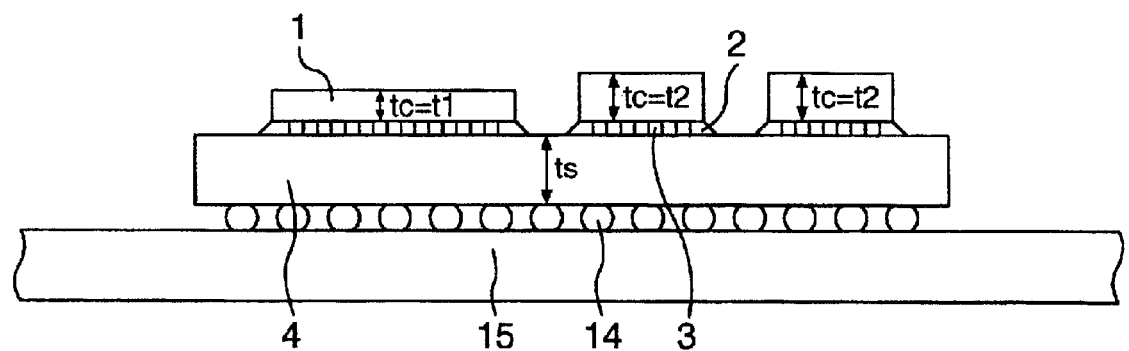
FIG. 1b is a schematic cross sectional side view taken along a line A–A' in FIG. 1a and showing the multi-chip-module (MCM) type semiconductor device as the first embodiment.

In a first embodiment as shown in FIGS. 1a and 1b, semiconductor elements 1 of bare chips are mounted onto and electrically connected to a substrate 4. Other electric parts 5 of, for example, capacitor may be arranged on the substrate 4. A thickness t1 of the semiconductor element 1 having relatively large area or minimum side length as seen in a substrate and semiconductor element staking direction or thickness direction is smaller than a thickness t2 of the semiconductor element 1 having relatively small area or minimum side length as seen in the thickness direction. The thickness of the semiconductor element 1 is a thickness of a residual wafer between, for example, a gate insulating layer and a reverse surface (other than an oxidized layer).

By this embodiment, a difference between a stress at a connecting portion, for example, bumps 14, between the substrate 4 and a mother board 15 under the semiconductor element 1 having the relatively large area and the relatively small thickness t1 and a stress at the connecting portion between the substrate 4 and the mother board 15 under the semiconductor element 1 having the relatively small area and the relatively large thickness t2 is decreased, so that a stress distribution over all of the bumps 14 can be made relatively constant. In this embodiment, it is preferable for at least the semiconductor element 1 having the relatively small area and the relatively large thickness t2 to have a width not more than 7 mm as understood from FIG. 9.

As shown in FIG. 15, the semiconductor elements 1 of bare chips are made by dicing a semiconductor wafer of thickness tw (for example, about 0.75 mm). A main component of the semiconductor elements 1 may be Si or GaAs. When the thickness of the semiconductor element 1 is decreased from tw to tc, for example, a grinder-finishing on the reverse surface (not the surface facing to the substrate) as shown in FIG. 15, is performed before being mounted on the substrate 4. Electrically conductive bumps 3 for connecting electrically the semiconductor elements 1 to the substrate 4 are attached to the semiconductor element 1 before being mounted on the substrate 4. A main component of the bumps 3 may be Pb—Sn solder for general use, Pb-free solder preferable for the environment or Au preferable for small bump distance and/or diameter. When Cu rather than Al is used for wiring on the semiconductor element 1, the main component of the bumps 3 may be Cu rather than Au. The substrate 4 is usually formed by an organic synthetic resin, for example, glass-epoxy or the like, having a linear expansion coefficient of small difference from a linear expansion coefficient of the mother board, but may be formed by a ceramic of small difference from a linear expansion coefficient of the semiconductor element 1 so that a thermal stress of the semiconductor element 1 is decreased. It is preferable for a thickness of the substrate 4 is larger than the thickness to of the semiconductor element 1. Each of the semiconductor elements 1 and the substrate 4 is connected by reflow-heating of the bumps 3 of solder. When the bumps 3 is made of Au, the semiconductor elements 1 are fixed to the substrate 4 while being pressed against the substrate 4 and generating an ultrasonic vibration for heating therebetween. An organic synthetic resin, for example, epoxy resin, is inserted into a space (distance of 0.01–0.1 mm) to be cured between the each of the semiconductor elements 1 and the substrate 4 to form an under-fill 2 therebetween. A tape-shaped thermoplastic synthetic resin (for example, anisotropic electrically conductive resin (ACF)) may be inserted into the space between the each of the semiconductor elements 1 and the substrate 4 before heating the bumps 3, to form the under-fill 2 therebetween.

Figure 12A:
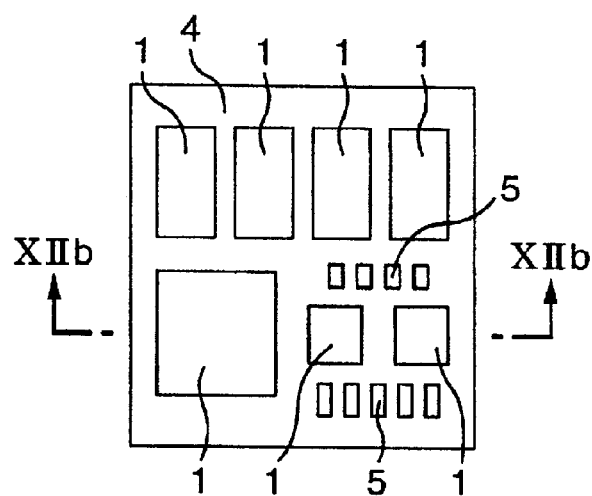
FIG. 12a is a schematic front view showing a multi-chip-module (MCM) type semiconductor device as a second embodiment of the invention.
Figure 12B:
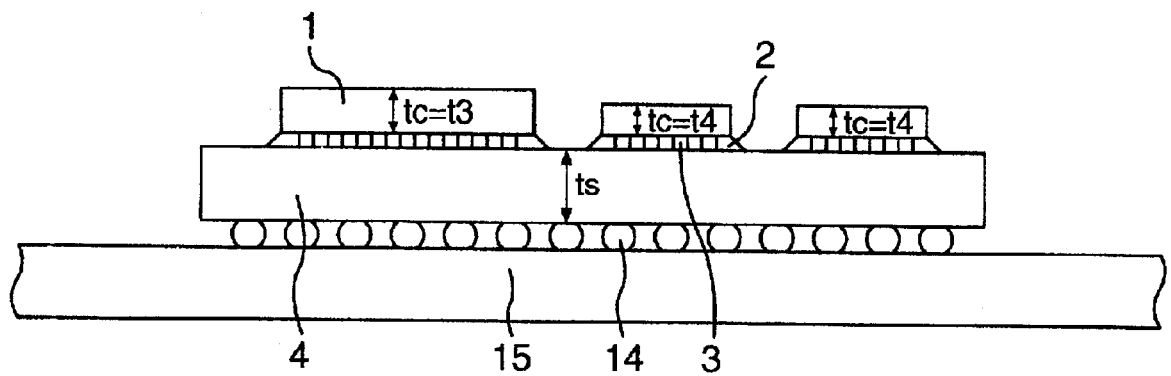
FIG. 12b is a schematic cross sectional side view showing the multi-chip-module (MCM) type semiconductor device as the second embodiment.

In a second embodiment as shown in FIGS. 12a and 12b, a thickness t4 of the semiconductor element 1 having relatively small area or minimum side length as seen in the substrate and semiconductor element staking direction or thickness direction is smaller than a thickness t3 of the semiconductor element 1 having relatively large area or minimum side length as seen in the thickness direction. The thickness of the. semiconductor element 1 may be decreased to t4 by the grinder-finishing on the reverse surface of the semiconductor element 1 (not the surface facing to the substrate). When the crack occurs on a side surface of the semiconductor element 1 because of a low strength of the side surface, the smaller a length of a minimum side of rectangular shape of the reverse surface is, the smaller the thickness to of the semiconductor element 1 is.

Figure 13A:
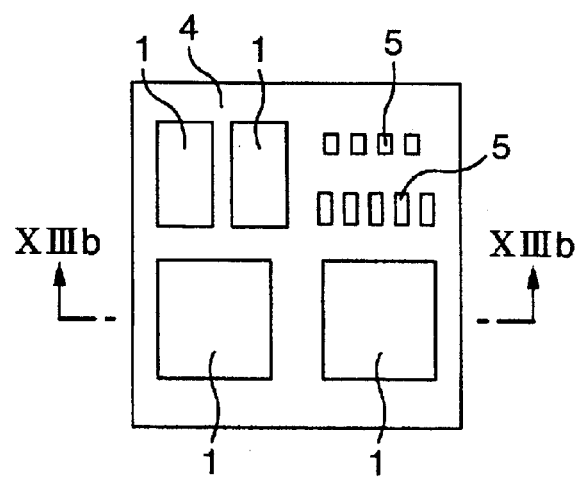
FIG. 13a is a schematic front view showing a multi-chip-module (MCM) type semiconductor device as a third embodiment of the invention.
Figure 13B:
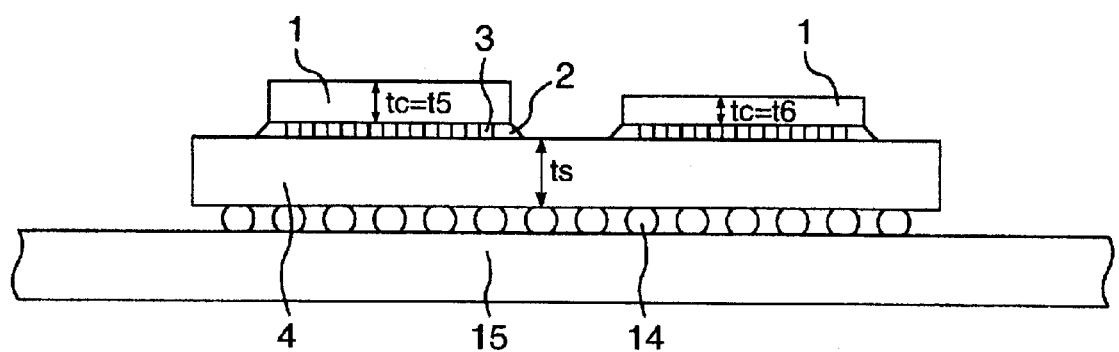
FIG. 13b is a schematic cross sectional side view showing the multi-chip-module (MCM) type semiconductor device as the third embodiment.

In a third embodiment as shown in FIGS. 13a and 13b, a thickness t5 of the semiconductor element 1 having relatively high thermal conductivity of the main component, for example, Si is larger than a thickness t6 of the semiconductor element 1 having relatively low thermal conductivity of the main component, for example, GaAs, so that a heat energy is effectively discharged from the semiconductor element 1 having relatively low thermal conductivity to restrain a thermal concentration on the substrate 4 and/or the semiconductor element 1.

Figure 14A:
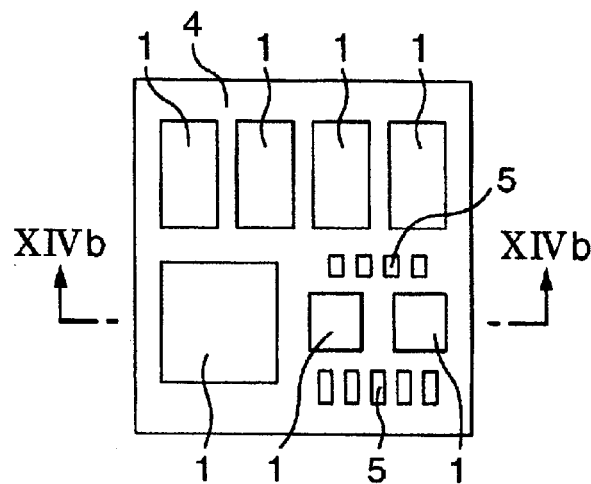
FIG. 14a is a schematic front view showing a multi-chip-module (MCM) type semiconductor device as a fourth embodiment of the invention.
Figure 14B:
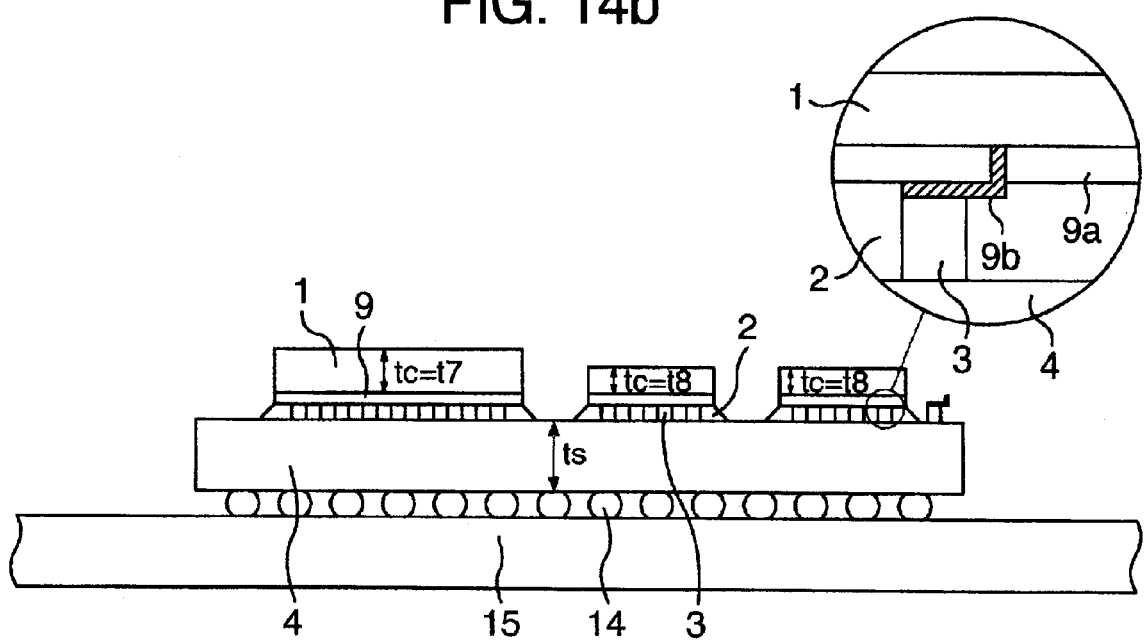
FIG. 14b is a schematic cross sectional side view showing the multi-chip-module (MCM) type semiconductor device as the fourth embodiment.

In a fourth embodiment of wafer process package (WPP) as shown in FIGS. 14a and 14b, on each of the semiconductor elements 1, the semiconductor element 1 is connected to the bumps 3 through a wiring layer 9 including an organic synthetic resin (for example, polyimide) insulating layer 9a and an electrically conductive member 9b (whose main component is, for example, Cu or Au, and whose rigidity is extremely small) extending a direction transversing the stacking or thickness direction so that a distance between the bumps 3 and/or a diameter of the bump 3 is increased in comparison with a distance between terminal gates of the semiconductor element and/or a diameter of terminal gates of the semiconductor element. A thickness of the wiring layer 9 may be 0.01–0.05 mm. The thickness of each of the semiconductor elements 1 is adjusted as shown in the above embodiments. The wiring layer 9 may be attached on the semiconductor element 1 after the thickness of the wafer is decreased by the grinder-finishing on the reverse surface. The bumps 3 are connected to the semiconductor element 1 through the wiring layer 9, in other words, the substrate 4, the bumps 3, the wiring layer 9 and the semiconductor elements 1 are connected in series. On the other hand, the under-fill 2 connects the semiconductor element 1 to the substrate 4 in parallel to the bumps 3.

Figure 16A:
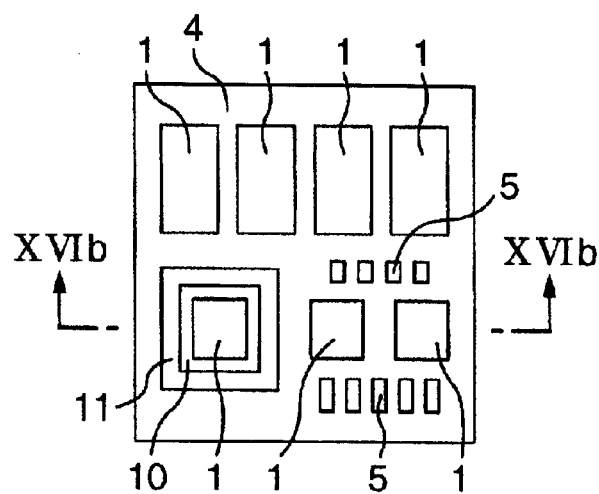
FIG. 16a is a schematic front view showing a multi-chip-module (MCM) type semiconductor device as a fifth embodiment of the invention.
Figure 16B:
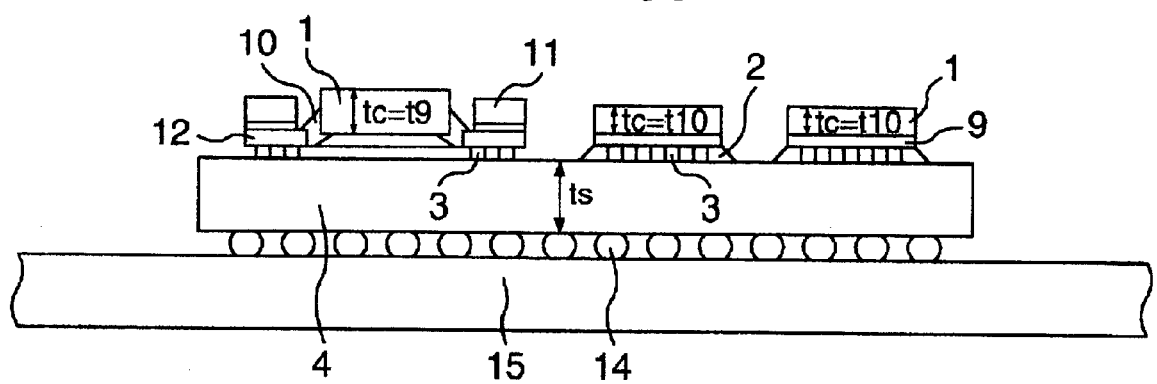
FIG. 16b is a schematic cross sectional side view showing the multi-chip-module (MCM) type semiconductor device as the fifth embodiment.
Figure 17A:
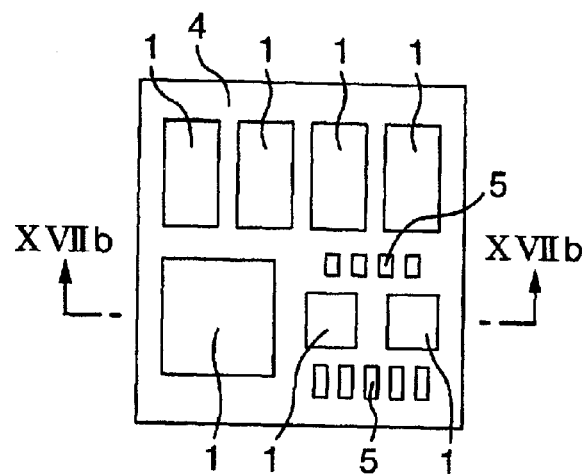
FIG. 17a is a schematic front view showing a multi-chip-module (MCM) type semiconductor device as a sixth embodiment of the invention.
Figure 17B:
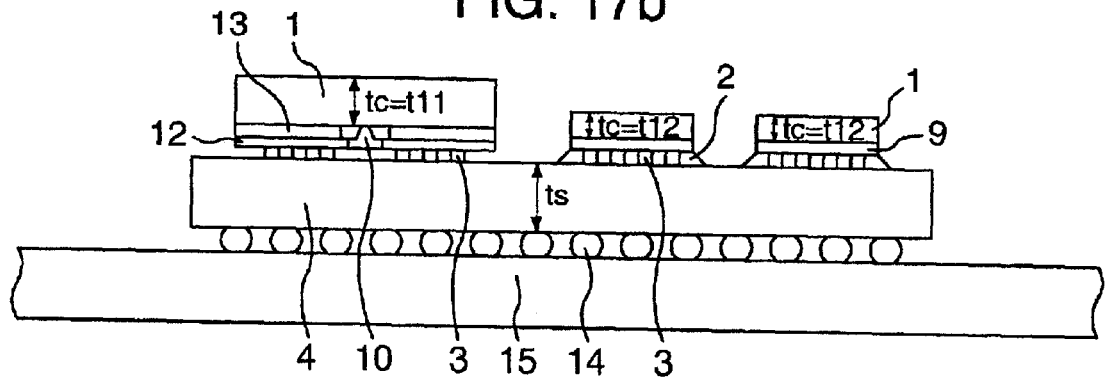
FIG. 17b is a schematic cross sectional side view showing the muiti-chip-module (MCM) type semiconductor device as the sixth embodiment.

In a fifth embodiment as shown in FIGS. 16a, 16b, 17a and 17b, a tape-shaped chip-size package (CSP) and the wafer process package (WPP) are mounted on the substrate 4. The CSP may be a fan-out CSP, as shown in FIGS. 16a and 16b, including a tape-shaped support plate 12 made of, for example, polyimide and connected to the substrate 4 through the bumps 3 arranged at the outside of the semiconductor element 1 as seen in the stacking or thickness direction, a reinforcing plate 11 of, for example, Cu for reinforcing the support plate 12, the semiconductor element 1 whose main component is Si or GaAs, and a sealing resin 10 extending outward from the semiconductor element 1 to the support plate 12 extending at the outside of the semiconductor element 1 as seen in the stacking or thickness direction while the semiconductor element 1 is prevented from being connected to the substrate 4 through the sealing resin 10, support plate 12 and bumps 3 at the inside of the semiconductor element 1 as seen in the stacking or thickness direction so that a connecting rigidity between the semiconductor element 1 and the support plate 12 is decreased by the sealing resin 10. The CSP may be a fan-in CSP, as shown in FIGS. 17a and 17b, including the tape-shaped support plate 12 connected to the substrate 4 through the bumps 3 arranged at the inside of the semiconductor element 1 as seen in the stacking or thickness direction, and a stress absorbing layer 13 made of an elastomer, for example, silicone rubber and connecting the tape-shaped support plate 12 to the semiconductor element 1. Through the tape-shaped support plate 12, electrically conductive members of extremely low rigidity for electrically connecting the semiconductor element 1 to the bumps 3 extends. In this case, the thickness of the semiconductor element 1 with the under-fill 2 between the semiconductor element 1 and the substrate 4 is smaller than a thickness of the semiconductor element 1 of CSP, because a connecting rigidity through the under-fill 2 between the semiconductor element 1 and the substrate 4 is larger than a connecting rigidity through the sealing resin 10 or the stress absorbing layer 13 (for example, without the under-fill 2) between the semiconductor element 1 and the substrate 4. Electrically conductive members (not shown) of extremely low rigidity extends through and/or along the sealing resin 10 to electrically connect the semiconductor element 1 to the bumps under the support plate 12.

Figure 18:
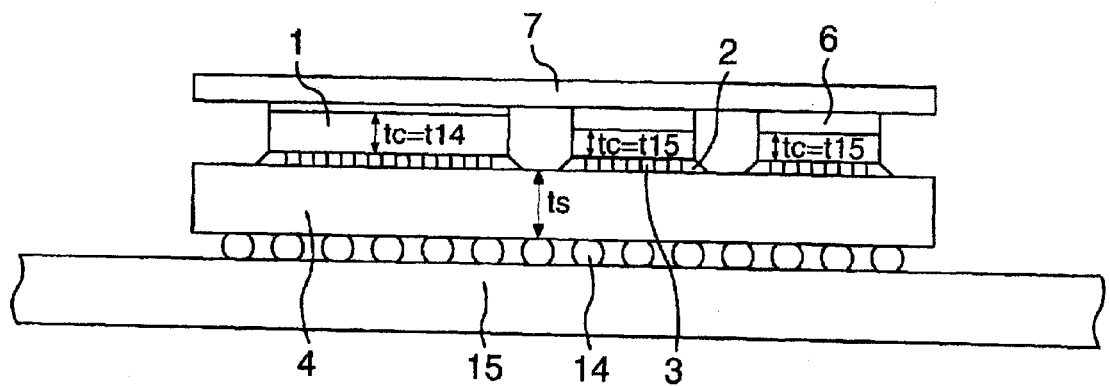
FIG. 18 is a schematic cross sectional side view showing a multi-chip-module (MCM) type semiconductor device as a seventh embodiment.

In a sixth embodiment as shown in FIG. 18, a heat-radiating or light-shielding plate 7 is attached onto the semiconductor elements 1 through an adhesive. Since Young's modulus of the adhesive (1–10GPa) is significantly smaller than those of the semiconductor element and the substrate, the heat-radiating or light-shielding plate does not affect the stress distribution on the semiconductor element. The heat-radiating or light-shielding plate 7 is effective to decrease the stress on the semiconductor element.

It should be further understood by those skilled in the art that the foregoing description has been made on embodiments of the invention and that various changes and modifications may be made in the invention without departing from the spirit of the invention and the scope of the appended claims.

What is claimed is:

1. A multi-chip-module type semiconductor device, comprising:
    a substrate adapted to be mounted onto a mother board and to be electrically connected to the mother board, on which substrate the first and second semiconductor elements are mounted to be electrically connected to the substrate,
    first and second semiconductor elements, a main component of each of the semiconductor elements being semiconductor material to form a semiconductor electric circuit in each of the semiconductor elements; and
    wherein an area of the second semiconductor element is more than an area of the first semiconductor element as seen in a stacking direction in which each of the first and second semiconductor elements and the substrate are stacked. and a thickness of the second semiconductor element is less than a thickness of the first semiconductor element.

2. A multi-chip-module type semiconductor device according to claim 1, further comprising a synthetic resin adhering to the substrate and each of the first and second semiconductor elements.

3. A multi-chip-module type semiconductor device, comprising:
    first and second semiconductor elements, a main component of each of the semiconductor elements being semiconductor material to form a semiconductor electric circuit in each of the semiconductor elements; and
    a substrate adapted to be mounted onto a mother board and to be electrically connected to the mother board, on which substrate the first and second semiconductor elements are mounted to be electrically connected to the substrate,
    wherein each of the first and second semiconductor elements includes a first surface facing to the substrate and a second surface as a reverse surface with respect to the first surface in a stacking direction in which each of the first and second semiconductor elements and the substrate are stacked, a thickness of the second semiconductor element is smaller than a thickness of the first semiconductor element, and the second surface of the first semiconductor element is prevented from being a grinder-finished surface while the second surface of the second semiconductor element is the grinder-finished surface.

4. A multi-chip-module type semiconductor device, comprising:
    first and second semiconductor elements, a main component of each of the semiconductor elements being semiconductor material to form a semiconductor electric circuit in each of the semiconductor elements; and
    a substrate adapted to be mounted onto a mother board and to be electrically connected to the mother board, on which substrate the first and second semiconductor elements are mounted to be electrically connected to the substrates
    wherein a length of a side of the second semiconductor element whose length is maximum in comparison with lengths of the other sides of the second semiconductor element as seen in a stacking direction in which each of the first and second semiconductor elements and the substrate are stacked is more than a length of a side of the first semiconductor element whose length is maximum in comparison with lengths of the other sides of the first semiconductor element as seen in the stacking direction, and a thickness of the second semiconductor element is less than a thickness of the first semiconductor element.

5. A multi-chip-module type semiconductor device according to claim 4, further comprising a synthetic resin adhering to the substrate and each of the first and second semiconductor elements.

6. A multi-chip-module type semiconductor device according to claim 4, wherein an area of the second semiconductor element is more than an area of the first semiconductor element as seen in a stacking direction in which each of the first and second semiconductor elements and the substrate are stacked, each of the first and second semiconductor elements includes a first surface facing to the substrate and a second surface as a reverse surface with respect to the first surface in a stacking direction in which each of the first and second semiconductor elements and the substrate are stacked, and the second surface of the first semiconductor element is prevented from being a grinder-finished surface while the second surface of the second semiconductor element is the grinder-finished surface.

7. A multi-chip-module type semiconductor device according to claim 6, further comprising a synthetic resin adhering to the substrate and each of the first and second semiconductor elements.

8. A multi-chip-module type semiconductor device, comprising:
    first and second semiconductor elements, a main component of each of the semiconductor elements being semiconductor material to form a semiconductor electric circuit in each of the semiconductor elements; and
    a substrate adapted to be mounted onto a mother board and to be electrically connected to the mother board, on which substrate the first and second semiconductor elements are mounted to be electrically connected to the substrate,
    wherein each of the first and second semiconductor elements includes a first surface facing to the substrate and a second surface as a reverse surface with respect to the first surface in a stacking direction in which each of the first and second semiconductor elements and the substrate are stacked, and the second surface of the first semiconductor element is prevented from being a grinder-finished surface while the second surface of the second semiconductor element is the grinder-finished surface.

9. A multi-chip-module type semiconductor device according to claim 8, comprising a synthetic resin adhering to the substrate and each of the first and second semiconductor elements.

10. A semiconductor device comprising:
    a substrate having a first substrate surface; and a plurality of semiconductor chips disposed upon the first substrate surface, each semiconductor chip having corresponding area and a corresponding thickness, wherein the semiconductor chips considered in increasing order of their corresponding areas have decreasing order in their corresponding thicknesses.

11. The semiconductor device of claim 10 wherein each area is determined for a surface of its corresponding semiconductor chip viewed along a stacking direction.

12. A multi-chip-module type semiconductor device according to claim 10, further comprising a synthetic resin adhering to the substrate and each of the first and second semiconductor elements.

13. A semiconductor device comprising:

a substrate having a first substrate surface; and a plurality of semiconductor chips disposed upon the first substrate surface, each semiconductor chip having corresponding area and a corresponding thickness, wherein the semiconductor chips considered in increasing order of their corresponding areas have decreasing order in their corresponding thicknesses, and wherein each of the semiconductor chips has a first chip surface and a second chip surface, the first chip surface in facing relation to the substrate surface, wherein at least one of the second chip surfaces is not a grinder-finished surface, wherein some of the second chip surfaces are grinder-finished surfaces.

14. A semiconductor device comprising:

a substrate having a substrate surface;

two or more semiconductor chips disposed upon the substrate surface, each semiconductor chip having a corresponding area and a corresponding thickness, wherein for each of the semiconductor chips, if its corresponding area is greater than the corresponding area of another semiconductor chip then its corresponding thickness is less than the corresponding thickness of the other semiconductor chip, and if its corresponding area is less than the corresponding area of the other semiconductor chip then its corresponding thickness is greater than the corresponding thickness of the other semiconductor chip.

15. The semiconductor device of claim 14 wherein each of the semiconductor chips comprises a first surface and a second surface, each first surface in facing relation to the substrate surface, at least one of the second surfaces being a grinder-finished surface.

16. The semiconductor device of claim 14 wherein the corresponding area for each of the semiconductor chips is determined for a surface of the semiconductor chip viewed in the stacking direction.

17. A multi-chip-module type semiconductor device according to claim 14, further comprising a synthetic resin adhering to the substrate and each of the first and second semiconductor elements.

18. A semiconductor device, comprising:

a substrate having a substrate surface; and two or more semiconductor chips disposed upon the substrate surface, each semiconductor chip having a corresponding area and a corresponding thickness, wherein for each of the semiconductor chips, if its corresponding area is greater than the corresponding area of another semiconductor chip then its corresponding thickness is less than the corresponding thickness of the other semiconductor chip, and if its corresponding area is less than the corresponding area of the other semiconductor chip then its corresponding thickness is greater than the corresponding thickness of the other semiconductor chip, wherein each of the semiconductor chips comprises a first surface and a second surface, each first surface in facing relation to the substrate surface, at least one of the second surfaces being a grinder-finished surface, and wherein at least one of the second surfaces is not a grinder-finished surface.

\* \* \* \* \*